(12) United States Patent
Lee

(10) Patent No.: US 9,142,557 B2
(45) Date of Patent: Sep. 22, 2015

(54) COST EFFECTIVE METHOD OF FORMING EMBEDDED DRAM CAPACITOR

(71) Applicant: Conversant Intellectual Property Management Inc., Ottawa (CA)

(72) Inventor: Soogeun Lee, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 14/496,797

(22) Filed: Sep. 25, 2014

(65) Prior Publication Data

US 2015/0102461 A1    Apr. 16, 2015

Related U.S. Application Data

(60) Provisional application No. 61/891,659, filed on Oct. 16, 2013.

(51) Int. Cl.

| H01L 27/108 | (2006.01) |
| H01L 29/76 | (2006.01) |
| H01L 29/94 | (2006.01) |
| H01L 31/119 | (2006.01) |
| H01L 49/02 | (2006.01) |
| H01L 23/532 | (2006.01) |

(52) U.S. Cl.
CPC ........ H01L 27/10844 (2013.01); H01L 27/108 (2013.01); H01L 28/75 (2013.01); *H01L 23/53238* (2013.01); *H01L 23/53295* (2013.01)

(58) Field of Classification Search
CPC ............ H01L 27/0733; H01L 27/0805; H01L 27/108; H01L 27/3265; H01L 28/40; H01L 28/60; H01L 29/92

See application file for complete search history.

(56) References Cited

U.S. PATENT DOCUMENTS

| 6,723,600 B2 | 4/2004 | Wong et al. |
| 6,884,710 B2 | 4/2005 | Park et al. |
| 7,482,684 B2 | 1/2009 | Oh et al. |
| 7,768,099 B2 | 8/2010 | Oates et al. |
| 8,513,112 B2 | 8/2013 | Ahn et al. |
| 2004/0087101 A1* | 5/2004 | Balakumar et al. ........... 438/396 |
| 2007/0057305 A1 | 3/2007 | Oates et al. |
| 2012/0091560 A1 | 4/2012 | Riess et al. |

FOREIGN PATENT DOCUMENTS

WO    2013052067 A1    4/2013

OTHER PUBLICATIONS

K.-C. Park et al., Advanced i-PVD Barrier Metal Deposition Technology for 90nnn Cu Interconnects, Proceedings of the IEEE 2003 International Interconnect Technology Conference, Jun. 2-4, 2003.
(Continued)

*Primary Examiner* — Hoai V Pham
(74) *Attorney, Agent, or Firm* — Daniel Hammond

(57) ABSTRACT

A high capacitance embedded metal interconnect capacitor and associated fabrication processes are disclosed for using a directional barrier metal formation sequence in a dual damascene copper process to form multi-layer stacked copper interconnect structure having reduced barrier metal layer formation at the bottom of each via hole so that the multi-layer stacked copper interconnect structure may be readily removed and replaced with high capacitance MIM capacitor layers.

12 Claims, 9 Drawing Sheets

(56) References Cited

OTHER PUBLICATIONS

K. Mikagi et al., Barrier Metal Free Copper Damascene Interconnection Technology Using Atmospheric Copper Reflow and Nitrogen Doping in SiOF Film, International Electron Devices Meeting, IEDM '96., Dec. 8-11, 1996.

U. Helmersson et al., Ionized Physical Vapor Deposition (IPVD): A Review of Technology and Applications, 2006, Thin Solid Films, (513), Issues 1-2, 1-24, Aug. 14, 2006, pp. 1-24.

Yu-Lin Kuo et al., Diffusion Barrier Properties of Sputtered TaNx Between Cu and Si Using TaN as the Target, www.sciencedirect.com, Materials Chemistry and Physics, vol. 80, Issue 3, Jun. 26, 2003, pp. 690-695.

J.M.T. Molarius et al., R.F.-Sputtered Tantalum-Based Diffusion Barriers Between Copper and Silicon, Superficies y Vacio 9, 206-209, Dec. 1999.

R. Brain et al., A 22nm High Performance Embedded FRAM SoC Technology Featuring Tri-Gate Transistors and MIMCAP COB, 2013 Symposium on VLSI Technology Digest of Technical Papers.

* cited by examiner

COST EFFECTIVE METHOD OF FORMING EMBEDDED DRAM CAPACITOR

BACKGROUND OF THE INVENTION

1. Field of the Invention

The present invention is directed in general to integrated circuit devices and methods for manufacturing same. In one aspect, the present invention relates to formation of a capacitor with metal interconnect structures.

2. Description of the Related Art

Integrated circuit devices, such as dynamic random access memory (DRAM) devices, increasingly require high performance capacitors with sufficient capacitance to extend the refresh period and increase tolerance to alpha particles. For example, a typical DRAM cell configuration includes a capacitor for storing a charge (i.e., the bit of information) and an access transistor that provides access to the capacitor during read and write operations. To provide the required capacitance for such high performance cell capacitors, the overlap area between an upper electrode (plate electrode) and a lower electrode (storage node electrode) should be increased and/or the thickness of a dielectric film interposed between the upper and lower electrodes should be reduced. While thinner dielectric films can be made using a high-k dielectric material having a high dielectric constant k, the thickness parameter of such high-k dielectric films is difficult to optimize as technological generations progress. While plate overlap can be increased by forming large, overlapping lateral capacitor plate layers, such structures reduce the pattern density at the memory region, resulting in loading effects during photo lithography, etch, and polishing steps. Another technique for increasing capacitance is to fabricate the capacitor in the semiconductor substrate as cylinder-shaped electrode plate that is concentrically positioned around a lower or storage node electrode plate to create the increased capacitance from the surface area of the storage node electrode. However, the height of such cylindrical capacitors is effectively limited by the constraints from high aspect ratio contact etch limitations which prevent contact etching from proceeding to a sufficient depth. Another approach for increasing the capacitor height (and charge storage) is to form embedded metal interconnect capacitors by using a wet etch chemistry to completely remove an exposed interconnect metal (e.g., copper) prior to forming the capacitor plate electrode and high-k dielectric layers, thereby preventing contamination of the high-k dielectric layer by the interconnect metal. However, such metal interconnect capacitors are typically limited to the height of one metal level due to the blocking of barrier metal at the bottom of the metal interconnect, and also require expensive photo step and etching of high aspect ratio contacts for capacitors.

BRIEF DESCRIPTION OF THE DRAWINGS

The present invention may be understood, and its numerous objects, features and advantages obtained, when the following detailed description is considered in conjunction with the following drawings, in which.

Figure 1:
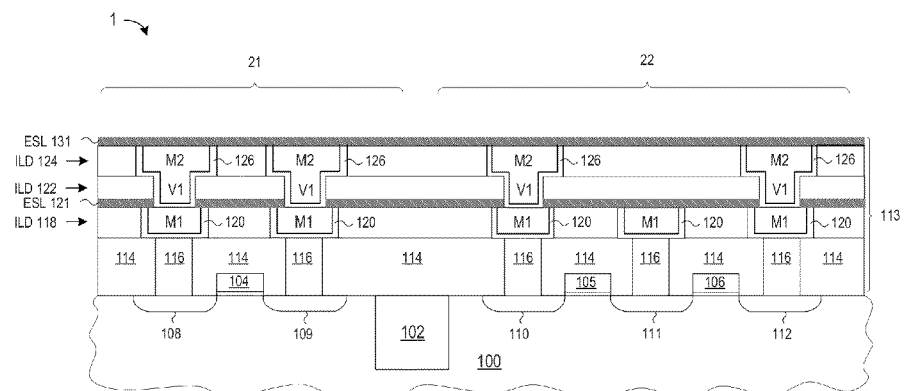
FIGS. 1-9 illustrate a partial cross-sectional view of a semiconductor device during successive phases of a fabrication sequence in which an embedded metal interconnect capacitor is formed with a plurality of metal layers to provide a high capacitance metal-insulator-metal capacitor in accordance with selected embodiments of the present disclosure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high capacitance embedded metal interconnect capacitor and associated fabrication processes are disclosed in which a directional barrier metal formation sequence is used in a dual damascene copper process to form multi-layer stacked copper interconnect structures having a barrier metal sidewall layer on each via and trench with very little or no barrier metal layer remaining at the bottom of each via hole. In selected embodiments, the directional barrier metal formation sequence includes a first barrier metal layer that is conformally deposited or sputtered on the via and trench openings to a predetermined thickness. Subsequently, a second barrier metal layer is formed on the first barrier metal layer by sputtering with an applied bias to remove or substantially thin the barrier metal layers at the bottom of the trench and via hole. As a result, the dual damascene copper interconnect has very little or no barrier metal at the bottom of the via hole. By applying a selective etch process, the multi-layer stacked copper interconnect structures may be removed to form a deep trench hole down through the multiple metal layers since there the barrier metal layer thickness remaining at the bottom of the via hole does not impede the etch process. In each deep trench hole, a high capacitance metal-insulator-metal capacitor may be formed by sequentially forming a bottom electrode plate layer, high-k dielectric layer, and top electrode plate layer. In selected embodiments, the high capacitance MIM capacitor is cost-effectively fabricated as an embedded DRAM capacitor without requiring expensive photo step and etching of high aspect ratio contacts for capacitors.

In this disclosure, an improved system, apparatus, and fabrication method are described for fabricating one or more embedded metal interconnect capacitor structures in a wafer or substrate that address various problems in the art where various limitations and disadvantages of conventional solutions and technologies will become apparent to one of skill in the art after reviewing the remainder of the present application with reference to the drawings and detailed description provided herein. For example, there are challenges with increasing the capacitance of integrated circuit capacitors imposed by material interactions with high-k dielectric materials, etch depth limitations imposed by vertical etching at high aspect ratios, and/or etch constraints imposed by barrier metal layers. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

Turning now to FIG. 1, there is shown a simplified cross-sectional view of a semiconductor device 1 having a substrate 100 (e.g., monocrystalline silicon, silicon germanium, or the like) with transistors formed in a logic region 21 and a memory region 22 and covered by a metal 2 level interconnect stack 113. Though example structures, well, and layer regions in the semiconductor device 1 are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well or source/drain regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

In the semiconductor device 1, the depicted substrate 100 may be formed as a bulk semiconductor substrate, semiconductor-on-insulator (SOI) type substrate or other semiconductor substrate material in which one or more additional semiconductor layers and/or well regions are formed using epitaxial semiconductor growth and/or selective doping techniques as described more fully hereinbelow. In an upper portion of the substrate 100, one or more shallow trench isolation (STI) structures 102 are formed that divide the substrate 100 into separate regions to provide isolated active circuit regions. As will be appreciated, the STI structures 102 may be formed using any desired technique, such as selectively etching openings in the substrate 100 using a patterned mask or photoresist layer (not shown), depositing a dielectric layer (e.g., oxide) to fill the opening, and then polishing the deposited dielectric layer until planarized with the remaining substrate 100. Any remaining unetched portions of the patterned mask or photoresist layer(s) are stripped. As will be appreciated, the STI structures 102 may be formed in other ways in other embodiments.

The upper portions of substrate 100 may also include one or more active substrate wells or layers (not shown) between the STI regions 102 that are formed by selectively implanting or diffusing appropriate polarity impurities into the substrate 100. As will be appreciated, the dopant type used to form the active well regions will depend on whether the transistors formed in each area are n-type or p-type devices. If desired, one or more additional deep well regions (not shown) may be formed to isolate the active well regions, such as by selectively implanting or diffusing appropriate polarity impurities.

Without belaboring the details, one or more active circuits or transistor devices are formed in the different regions 21, 22 and encapsulated with one or more inter-layer dielectric (ILD) layers 114. For example, the active circuits or transistor devices may be formed using any desired sequence of fabrication steps to define one or more patterned gate electrodes with sidewall implant spacers and one or more source/drain regions, and may include one or more defined electrically conductive contact structures 116 for electrically connecting the source/drain regions and/or gate electrodes to power or signal lines. For example, the logic region 21 includes one or more transistor devices formed with a gate electrode stack 104 and self-aligned source/drain regions 108-109 which are illustrated in simplified schematic form. In similar fashion, the memory region 22 includes one or more transistor devices formed with a gate electrode stack 105, 106 and self-aligned source/drain regions 110-112 which are illustrated in simplified schematic form. In other embodiments, the transistor devices can be made with any desired technology, such as MOSFET transistors, PINFET transistors, FINFET transistors, or the like, and may include different designs, such as buried bit lines, high-k metal gate electrodes, etc. As described hereinbelow, the transistors in the memory region 22 may be connected to corresponding embedded capacitors to form an embedded DRAM circuit, with a first access transistor formed with gate electrode stack 105 and source/drain regions 110, 111, and with a second access transistor formed with gate electrode stack 106 and source/drain regions 111, 112. To connect the transistor devices to a power or signal conductor, one or more contact structures 116 and first metal (M1) interconnect lines having barrier metal liner layers 120 are formed in one or more patterned inter-layer dielectric (ILD) layers 114, 118 using a dual damascene process to electrically connect to the source/drain regions 108-112 formed in the substrate 100. For example, the interconnect stack 113 may include a bottom planarized ILD layer 114 formed with a suitable dielectric material (e.g., SiO2, SiOC, SiOF, doped or undoped tetra-ethyl ortho-silicate (BPTEOS), or other low-k dielectric materials) by patterning and etching a first planarized dielectric layer 114 to form via openings over the source/drain regions 110-112 which are filled by depositing and polishing a metal layer (e.g., copper) to form the contact structures 116. Subsequently, a covering ILD layer 118 is formed on the bottom ILD layer 114 by patterning and etching a second planarized dielectric layer 118 to form trench openings over the contact structures 116 which are conformally coated with one or more relatively thin barrier metal layers (e.g., Ta, TaN, Ta/TaN, Ta/TiN, WN) and then filled by depositing and polishing a metal layer (e.g., copper, tungsten, or aluminum) with a chemical mechanical polish (CMP) process to form the first metal (M1) interconnect lines. At this point, a first etch stop layer 121 (e.g., SiN, SiC, SiCN, SiON, SiCON, or the like) is deposited on the entire surface of the semiconductor device 1 to serve as a base for forming the second metal (M2) interconnect level.

In forming the second metal (M2) interconnect level, the first etch stop layer 121 may be selectively patterned and etched to expose one or more of the first metal (M1) interconnect lines. On the first etch stop layer 121, a dual damascene process is used to form one or more first via (V1) structures and second metal (M2) interconnect lines having barrier metal liner layers 126 formed in one or more patterned interlayer dielectric (ILD) layers 122, 124. For example, the second metal (M2) interconnect level may include a first planarized dielectric layer 122 (which is patterned and etched to form first via (V1) openings aligned over one or more first metal (M1) interconnect lines) and a second, covering planarized dielectric layer 124 (which is patterned and etched to form second metal (M2) openings aligned with the V1 openings). Subsequently, the aligned V1 and M2 openings are conformally coated with one or more relatively thin barrier metal layers 126 (e.g., Ta, TaN, Ta/TaN, Ta/TiN, or WN) and then filled by depositing a metal layer (e.g., copper), followed by CMP planarization to form the second metal (M2) interconnect lines. Then, a second etch stop layer 131 is formed on the entire surface of the semiconductor device. In other embodiments, barrier-metal-free copper damascene processes may be used to form the interconnect levels, such as disclosed in U.S. Pat. No. 8,513,112.

Figure 2:
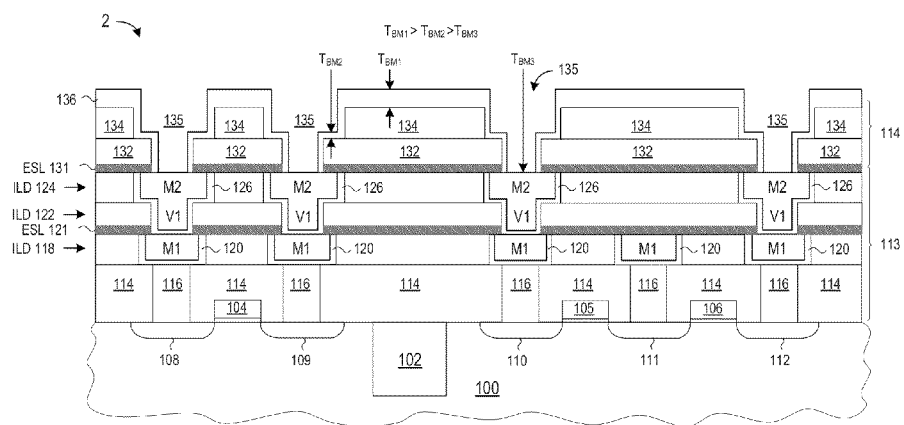

FIG. 2 is a simplified cross-sectional view illustrating processing of the semiconductor device 2 subsequent to FIG. 1 after forming a first barrier metal layer 136 in a patterned ILD stack 132, 134 in the course of fabricating a metal interconnect stack 114 on the metal 2 level interconnect stack 113. In selected embodiments, the patterned ILD stack 132, 134 may be formed by depositing and patterning first and second planarized dielectric layers 132, 134 on the second etch stop layer 131 to form patterned openings 135, including second via (V2) openings aligned over one or more second metal (M2) interconnect lines and third metal (M3) openings aligned with the V2 openings. To etch the via and trench openings, a patterned photoresist layer or etch mask (not shown) may be formed on the planarized interlayer dielectric layer being etched and an anisotropic etch process may be applied to selectively etch or remove portions of at least the planarized interlayer dielectric layers to form the via or trench opening. Thus aligned, the bottom and sidewall surfaces of the V2 and M3 openings 135 may be conformally coated with a first barrier metal layer 136 using chemical vapor deposition (CVD), plasma-enhanced chemical vapor deposition (PECVD), physical vapor deposition (PVD), atomic layer deposition (ALD), molecular beam deposition (MBD), or any combination(s) of the above. In selected embodiments, the first barrier metal layer 136 may be formed by a low temperature PECVD, sputtering, or ALD process to a predetermined final thickness in the range of 1-100 Angstroms (e.g., 15-25 Angstroms), though other thicknesses may be used. While the first barrier metal layer 136 may be formed with sputtered or ALD barrier metal layers, such as Ta, TaN, Ta/TaN, Ta/TiN, or WN, the first barrier metal layer 136 may also be formed with a conductive material that does not include a barrier metal. In selected embodiments where the first barrier metal layer 136 is directionally deposited as a sputtered PVD layer, the thickness of the layer 136 is determined by the trajectory area over the region of interest and the orientation of the opening surface (e.g., sidewall or horizontal). Thus, the first barrier metal layer 136 is formed on all sidewall surfaces of the trench and via openings 135, but has a first thickness dimension ($T_{BM1}$) on the top of the ILD layer 134, a second relatively thinner thickness dimension ($T_{BM2}$) on the bottom of the trench opening (and on top of the ILD layer 132), and a third thinnest dimension ($T_{BM3}$) on the bottom of the via opening (and on top of the second metal (M2) interconnect lines). In other words, $T_{BM1} > T_{BM2} > T_{BM3}$. Indeed, with the limited trajectory area of the entrance over the via opening, there may not be any of the first barrier metal layer 136 remaining at the bottom of the via opening.

Figure 3:
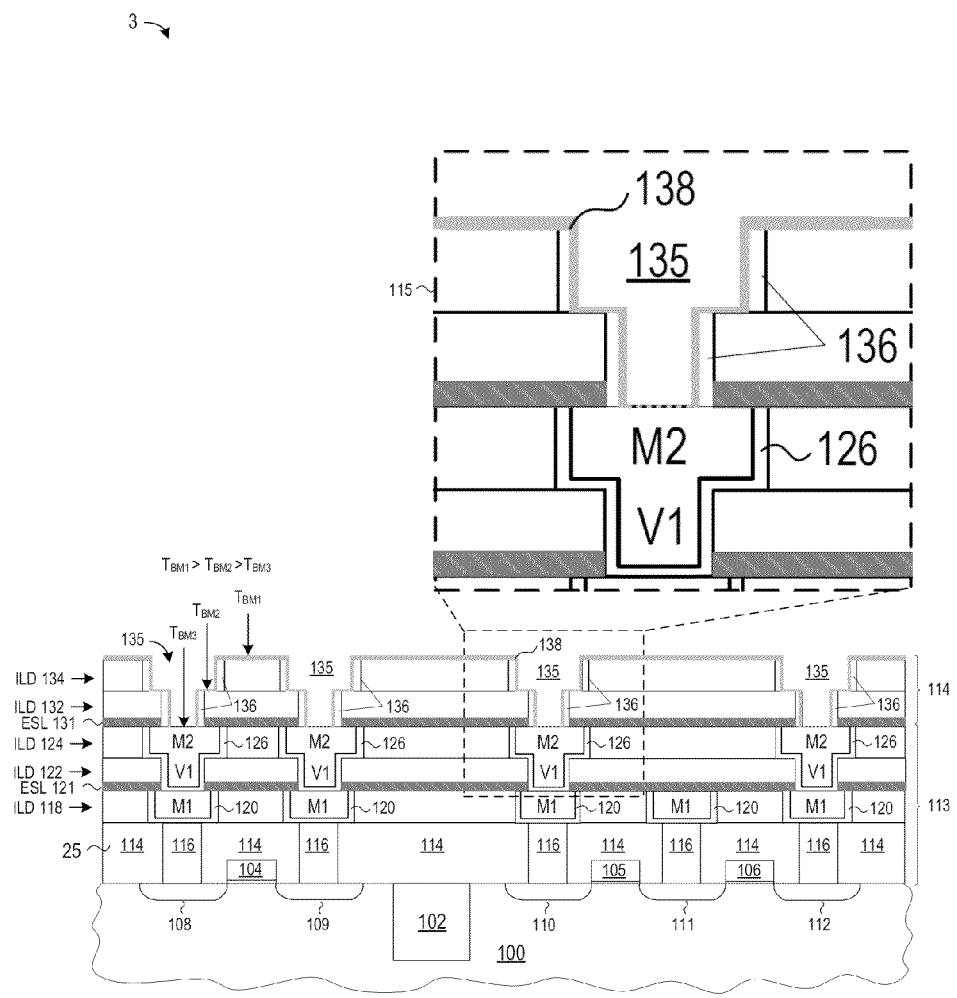

At the fabrication stage shown in FIG. 2, the presence of any barrier metal layer at the bottom of the patterned openings 135 may impede or prevent any attempt to selectively etch through to the underlying first metal (M1) interconnect lines. To remove this impediment, there is disclosed herein a directional barrier metal formation sequence for forming one or more thin or discontinuous barrier metal layer(s) 138 at the bottom of the via holes 135 while leaving one or more thin remnant barrier metal layers 136, 138 on the vertical sidewall surfaces and at the bottom of the trench opening to prevent copper atoms from diffusing into the ILD layer(s). For example and as illustrated with reference to FIG. 3, there is shown a simplified cross-sectional view illustrating processing of the semiconductor device 3 subsequent to FIG. 2 after directionally forming a second barrier metal layer 138 in the patterned ILD stack 132, 134 with a directional process which removes or thins portions of the first barrier metal layer 136 at the bottom of the trench and via holes 135 and also from any other horizontal surface on the patterned ILD stack 132, 134 while forming one or more thin or discontinuous barrier metal layer(s) 138 in the sidewall surfaces and at the bottom of the via holes 135. In selected embodiments, the second barrier metal layer 138 is deposited using RF sputtering, PECVD, PVD, or MBD processing in the presence of predetermined bias conditions such that portions of the barrier metal layers remaining at the bottom of the trench and via holes 135 are very thin or discontinuous (indicated with dashed lines). That is, by RF resputtering with appropriate bias conditions, the barrier metal layer(s) at the bottom of the patterned openings 135 is etched during the sputtering, and the etched material 138 adheres to sidewalls of the patterned openings 135 as a result of the bias condition. In selected embodiments, the second barrier metal layer 138 may be formed with a low temperature RF sputtering with bias to a predetermined final thickness in the range of 1-50 Angstroms (e.g., 1-10 Angstroms), though other thicknesses may be used. As a result, there is very little or no barrier metal remaining on the bottoms of the patterned openings 135, as shown in FIG. 3 with the enlarged view 115. In selected embodiments where the second barrier metal layer 138 is resputtered with a high bias voltage, the thickness of the barrier metal layers 136, 138 is determined by the trajectory area over the region of interest and the orientation of the opening surface (e.g., sidewall or horizontal) and also by the interaction of the biased resputtering process with the barrier metal layers 136, 138. Thus, a sputtering process thins all portions of the first barrier metal layer 136 formed on horizontal surfaces (e.g., at the bottom of the trench and via openings) while simultaneously forming the second barrier metal layer 138 on all sidewall surfaces of the trench and via openings 135. As shown in FIG. 3, the second barrier metal layer 138 is formed as a continuous layer on the top of the ILD layer 134 and has a first thickness dimension ($T_{BM1}$) (alone or in combination with any remaining first barrier metal layer 136). In similar fashion, the second barrier metal layer 138 has a second relatively thinner thickness dimension ($T_{BM2}$) on the bottom of the trench opening (and on top of the ILD layer 132), and a third thinnest dimension ($T_{BM3}$) on the bottom of the via opening (and on top of the second metal (M2) interconnect lines). In other words, $T_{BM1} > T_{BM2} > T_{BM3}$. Again, the limited trajectory area of the entrance over the via opening limits the thickness of the second barrier metal layer 138 formed at the bottom of the via opening. In addition or in the alternative, an additional sputtering process may be applied after depositing the second barrier metal layer 138 to help remove the barrier metal layer(s) 138 from the bottom of the via opening while leaving barrier metal layer(s) on the trench bottom and on the ILD layers 132, 134.

Figure 4:
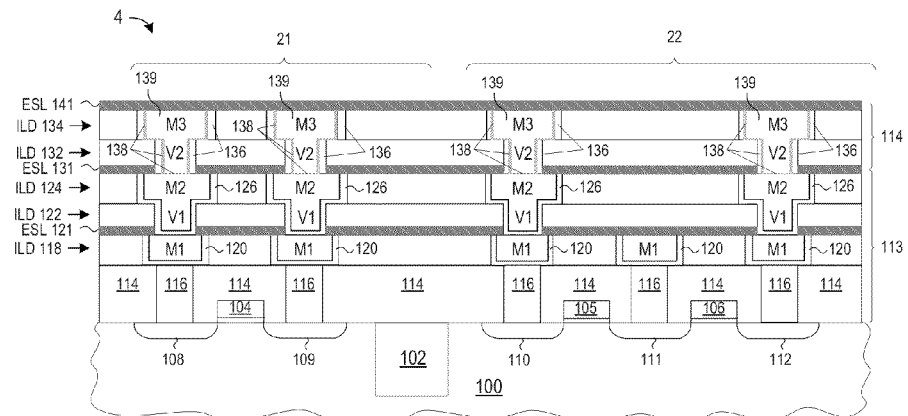

With the barrier metal layers thinned and/or removed from the bottom of the patterned openings 135, the patterned openings 135 may be filled with a conductive interconnect material. For example, FIG. 4 is a simplified cross-sectional view illustrating processing of the semiconductor device 4 subsequent to FIG. 3 after filling the patterned openings 135 with a polished copper layer 139 to complete the metal interconnect stack 114. In selected embodiments, a layer of copper is deposited over the semiconductor device 4 to fill the patterned openings 135 in the patterned ILD stack 132, 134, and is then planarized with a CMP process to remove the copper and any remaining portions of the barrier metal layers from the exposed upper surface of the patterned ILD layer 134, thereby forming a M3/V2 dual damascene interconnection. Subsequently, a third etch stop layer 141 is formed on the entire surface of the semiconductor device 4.

As disclosed herein, the directional barrier metal formation sequence may be used to form one or more additional metal interconnect stacks 115 in the same manner as used to form the metal interconnect stack 114. For example and as illustrated with reference to FIG. 5, there is shown a simplified cross-sectional view illustrating processing of the semiconductor device 5 subsequent to FIG. 4 after a plurality of metal interconnect stacks 114-115 is formed using the directional barrier metal formation sequence until the desired stack height of the interconnections reaches to a target value (e.g., up to a metal "n" level). At each interconnect stack level, the base etch stop layer 141, 151, 161 is patterned and etched to form one or more openings exposing the underlying metal interconnect lines. In addition, a patterned ILD stack 142/144, 152/154, 162/164 is formed with patterned openings aligned for electrical connection to the underlying metal interconnect lines. In each patterned opening, the first diffusion barrier metal layers 146, 156, 166 and second diffusion barrier metal layers 148, 158, 168 are sequentially formed by sputtering or by ALD, where each second diffusion barrier metal layer is formed on a corresponding first diffusion barrier metal by RF sputtering with bias to effectively remove or thin the portions of the first diffusion barrier metal layer from the bottom of the trench and via hole. After thinning or remove the barrier metal layer from the bottom of the via opening at each interconnect stack level, a planarized copper layer is formed to fill the dual damascene trenches and via holes in the patterned ILD stack 142/144, 152/154, 164/162 by applying a CMP process to remove overflow copper and any portions of the barrier metal layers formed on an upper surface of the patterned ILD stack, and a covering etch stop layer 151, 161, 171 is formed. In this way, each of the multi-layer stacked copper interconnect structures formed between the aligned second metal (M2) layer and "metal n" layer is formed as a substantially continuous copper layer which does not include any significant diffusion barrier metal layers except on the sidewalls of the trench and via structures.

Figure 5:
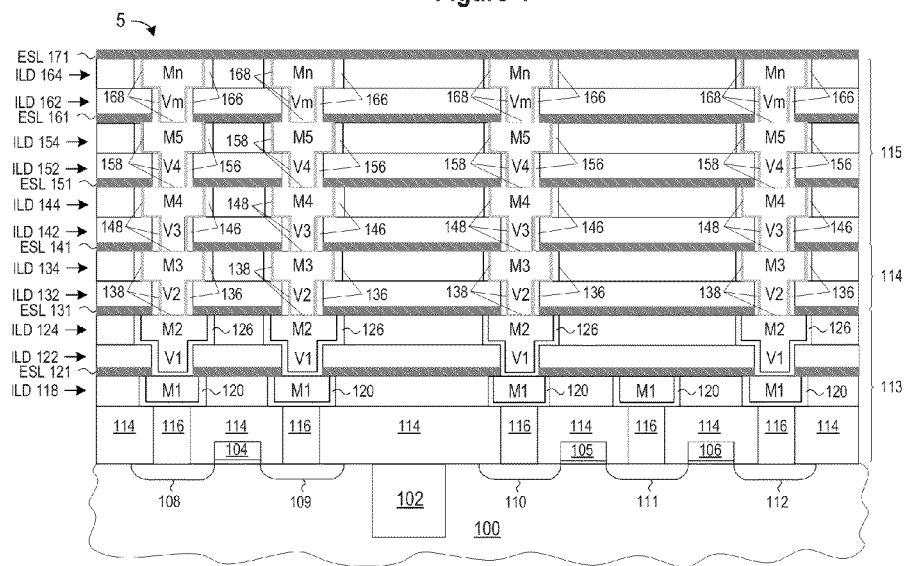
Figure 6:
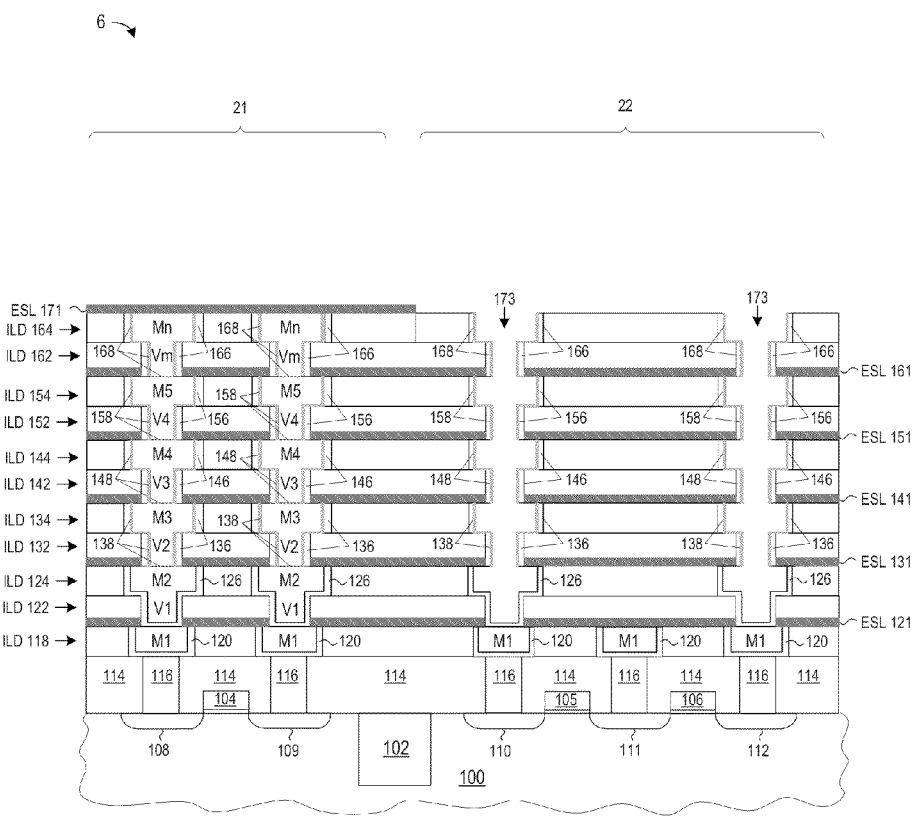

FIG. 6 is a simplified cross-sectional view illustrating processing of the semiconductor device 6 subsequent to FIG. 5 after the multi-layer stacked copper interconnect structures are selectively removed from the memory region 22 to form one or more deep trench holes 173 down through the plurality of metal interconnect stacks. As a preliminary step, the protective etch stop layer 171 is patterned and etched to leave a protective etch stop layer 172 over the logic region 21, thereby exposing the uppermost ILD layer 164 and top surfaces of the multi-layer stacked copper interconnect structures in the memory region 22. The exposed multi-layer stacked copper interconnect structures are then selectively removed using any desired selective etch technique to form the deep trench holes 173. Examples of such selective etch processes include, but are not limited to using a wet or dry etch chemistry, ablation, or any combination thereof. In selected embodiments, the etch process is controlled to be selective to all the materials used in the backend process, such as, for example, interconnect barrier materials (e.g., tantalum), etch stop materials (e.g., silicon nitride), and interlayer dielectric materials (e.g., silicon dioxide) so that such materials remain substantially intact.

Figure 7:
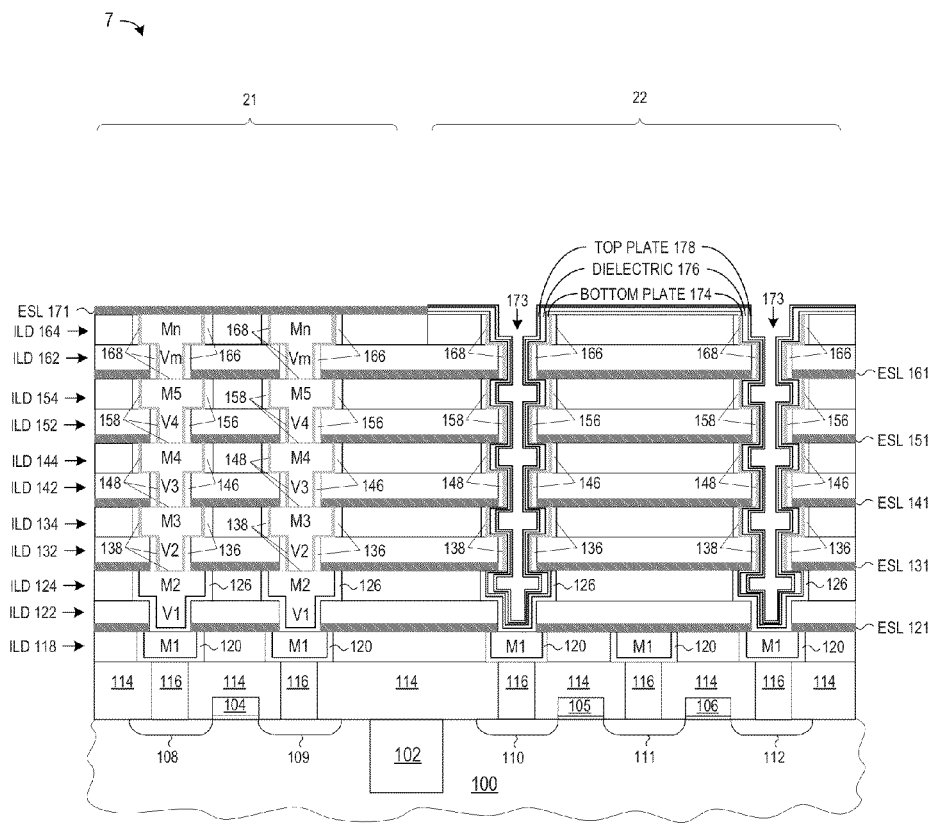

FIG. 7 is a simplified cross-sectional view illustrating processing of the semiconductor device 7 subsequent to FIG. 6 after forming a high capacitance metal-insulator-metal capacitor in each deep trench hole by sequentially forming a bottom electrode plate layer, high-k dielectric layer, and top electrode plate layer. In selected embodiments, a bottom plate electrode layer 174 is formed by conformally depositing one or more suitable conductor materials (e.g., TiN, TaN) on the sidewall and bottom surfaces of the deep trench holes 173 using CVD, PECVD, PVD, ALD, MBD, or any combination(s) thereof to a predetermined thickness in the range of 5-200 Angstroms (e.g., 20-50 Angstroms), though other materials and thicknesses may be used. On the bottom plate electrode layer 174, a suitable dielectric layer 176 may be conformally deposited, such as by using CVD, PECVD, ALD, MBD, or any combination(s) thereof to deposit a high-k dielectric layer 176. By properly controlling the fabrication of the multi-layer stacked copper interconnect structures as described hereinabove, the entirety of the bottom plate electrode layer 174 formed in the deep trench hole 173 is separated from the ILD layers 122, 124, 132, 134, 142, 144, 152, 154, 162, 164 by the barrier metal layers 126, 136, 138, 146, 148, 156, 158, 166, 168 and patterned etch stop layers 121, 131, 141, 151, 161. A suitable high-k dielectric material is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. On the dielectric layer 176, a top plate electrode layer 178 may be formed by conformally depositing one or more suitable conductor materials (e.g., TiN, TaN) using CVD, PECVD, ALD, MBD, or any combination(s) thereof to a predetermined thickness in the range of 5-200 Angstroms (e.g., 20-50 Angstroms), though other materials and thicknesses may be used. As illustrated, the conformal bottom electrode plate layer, high-k dielectric layer, and top electrode plate layer form a continuous MIM stack in a plurality of deep trench holes which must be electrically separated to form individual embedded metal interconnect capacitors for each memory cell.

Figure 8:
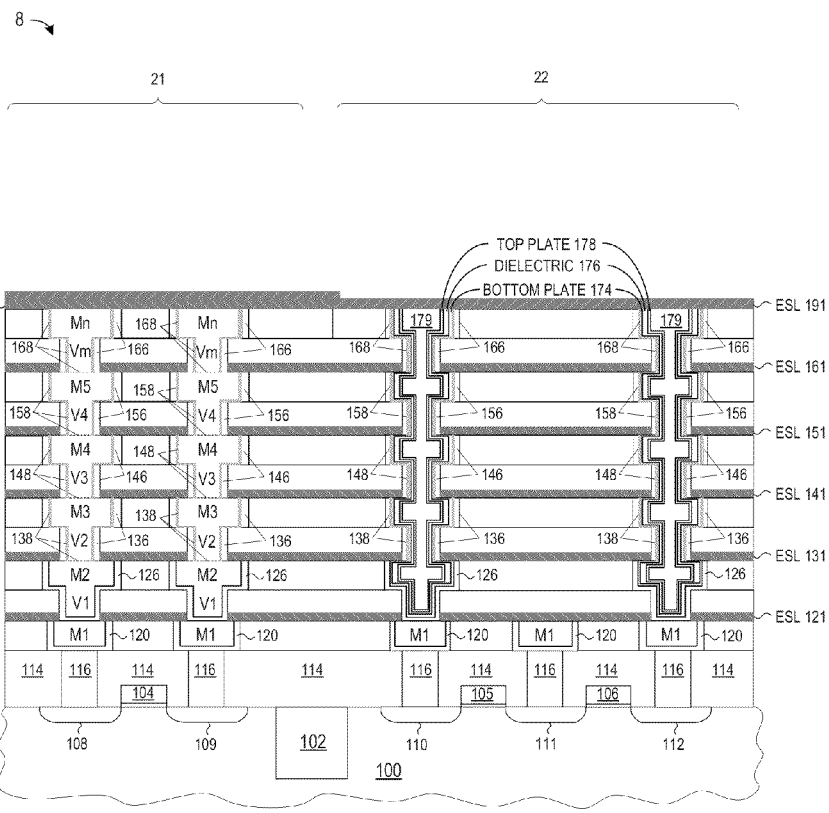

To this end, reference is now made to FIG. 8 which is a simplified cross-sectional view illustrating processing of the semiconductor device 8 subsequent to FIG. 7 after filling the remainder of the deep trench holes 173 in the memory cell region 22 with a polished copper layer 179 to complete top electrode plate. In selected embodiments, one or more layers of conductive metal material 179 may be formed on the top electrode plate layer 178 and planarized to fill the deep trench holes 173, such as by forming one or more layers of suitable conductive material (e.g., copper) using CVD, PECVD, sputtering, PVD, electro-plating, electro-less plating, or the like, followed by chemical mechanical polish (CMP) planarization to remove the copper and any remaining portions of the MIM capacitor layers 174, 176, 178, 179 from the exposed upper surface of the patterned ILD layer 164. Subsequently, a covering etch stop layer 191 is formed on the entire surface of the semiconductor device 8 to form a single ESL layer 191 over the memory region 22 and a double ESL layer 171, 191 over the logic region 21.

Figure 9:
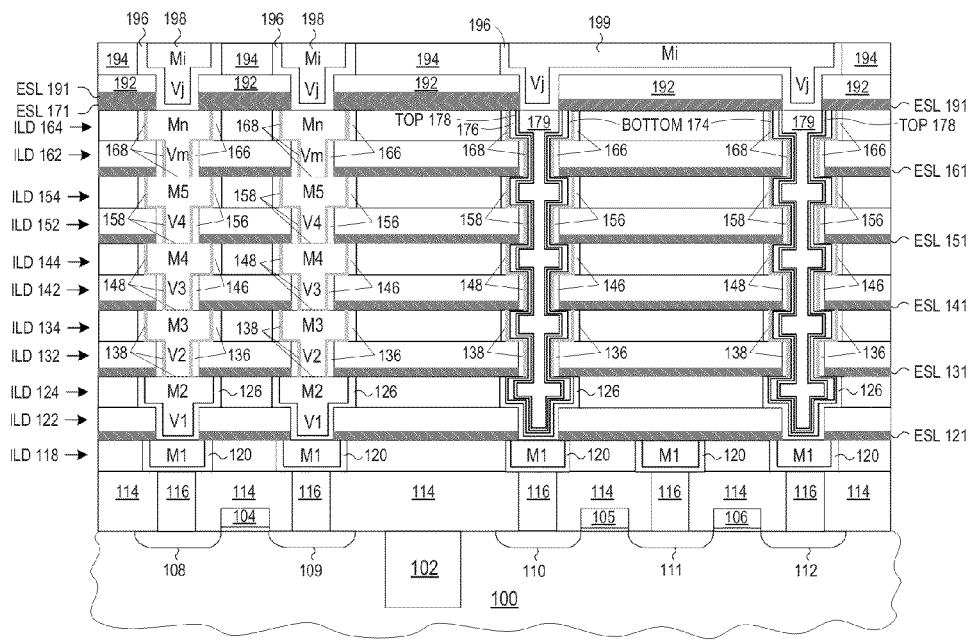

As will be appreciated, any number of additional backend or finishing processes can be used to complete the semiconductor device, such forming any necessary metal contacts, additional inter-layer dielectric layers, planarization, passivation, addition of subsequent layers or stacks, etc. For example, FIG. 9 shows a simplified cross-sectional view illustrating processing of the semiconductor device 9 subsequent to FIG. 8 after forming one or more additional interconnect stack levels with metal interconnect lines over the logic and memory cell regions 21, 22. In selected embodiments, each additional interconnect stack level may be formed by selectively patterning and etching the ESL layers 171, 191 to expose the uppermost metal (Mn) interconnect lines in the logic region 21 and polished copper structures 179 in the memory cell region 22. As illustrated, the pattern and etch process is controlled to ensure that the patterned etch stop layers 171, 191 cover the ends of the bottom plate electrode layer 174, thereby isolating the ends of the bottom plate electrode layer 174 from the ends of the top plate electrode layer 178. On the patterned etch stop layers 171, 191, a dual damascene process is used to form one or more via (Vj) structures and metal (Mi) interconnect lines having barrier metal liner layers 196 formed in one or more patterned inter-layer dielectric (ILD) layers 192, 194. For example, a first planarized dielectric layer 192 may be patterned and etched to form the via (Vj) openings aligned over the uppermost metal (Mn) interconnect lines in the logic region 21 and polished copper structures 179 in the memory cell region 22. Subsequently, a second planarized dielectric layer 194 may be patterned and etched to form metal (Mi) openings aligned with the Vj openings. In the aligned Vj and Mi openings, one or more relatively thin barrier metal layers 196 (e.g., Ta, TaN, Ta/TaN, Ta/TiN, or WN) are conformally deposited using sputtering, CVD, PECVD, PVD, ALD, MBD, or any combination(s) thereof to a predetermined thickness in the range of 5-1000 Angstroms (e.g., 10-100 Angstroms). As illustrated, the conformally deposited barrier metal layers 196 cover the bottom and sidewall surfaces of the openings. On the barrier metal layer 196, one or more layers of conductive metal material 198, 199 may be formed and planarized to fill the Vj and Mi openings, such as by forming one or more layers of suitable conductive material (e.g., copper) using CVD, PECVD, sputtering, PVD, electro-plating, electro-less plating, or the like, followed by chemical mechanical polish (CMP) planarization. In the memory cell region, the resulting planarized conductor layer 199 is electrically connected to the top plate electrode layer 178 of the embedded metal interconnect capacitor in each cell, where the bottom plate electrode layer in each embedded metal interconnect capacitor is connected across a respective transistor device to a separately controlled voltage node 111 in the substrate 100 to provide a buried bit line configuration. In addition, the bottom plate electrode layer 174 is separated from the ILD layers 122, 124, 132, 134, 142, 144, 152, 154, 162, 164 by the barrier metal layers 126, 136, 138, 146, 148, 156, 158, 166, 168 and patterned etch stop layers 121, 131, 141, 151, 161.

As will be appreciated, other back-end fabrication processes may be used to complete the embedded metal interconnect capacitor structures. For example, the MIM capacitor plate electrode layers may be patterned and electrically isolated from one another without requiring formation of an additional etch stop layer. To illustrate an example alternative embodiment, reference is now made to FIG. 10 which shows a simplified cross-sectional view illustrating processing of the semiconductor device 10 subsequent to FIG. 7 after patterning and etching the MIM capacitor layers 174, 176, 178 to form openings 200 which define landing pads 201 for the top plate electrode layer 178. Though not shown, it will be appreciated that a patterned layer of photoresist or other patterned etch mask may be used to pattern and etch the MIM capacitor layers 174, 176, 178. With the patterned photoresist/etch mask in place, one or more anisotropic etch processes, such as an RIE etch, may be applied to define one or more patterned openings 200 to selectively pattern the MIM capacitor layers 174, 176, 178 to form the top plate electrode layer landing pads 201.

Figure 10:
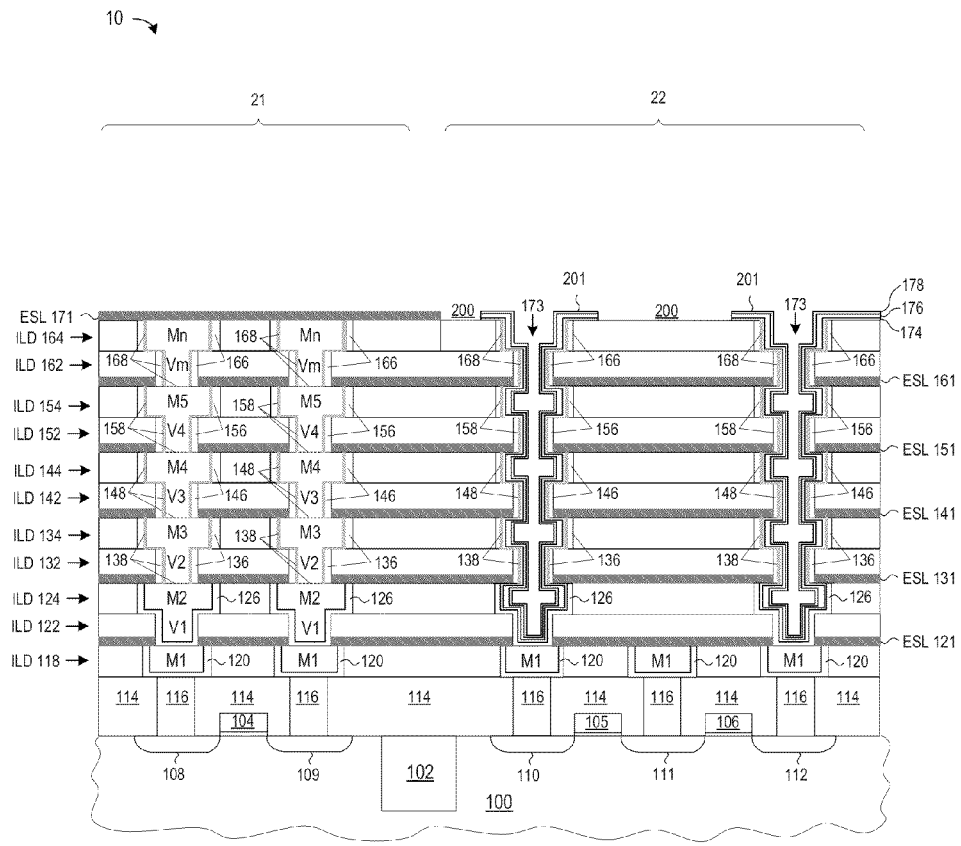
FIGS. 10-11 illustrate a partial cross-sectional view of a semiconductor device during successive phases of a fabrication sequence in which an embedded metal interconnect capacitor is formed with a plurality of patterned metal layers to provide high capacitance metal-insulator-metal capacitor in accordance with selected embodiments of the present disclosure.
Figure 11:
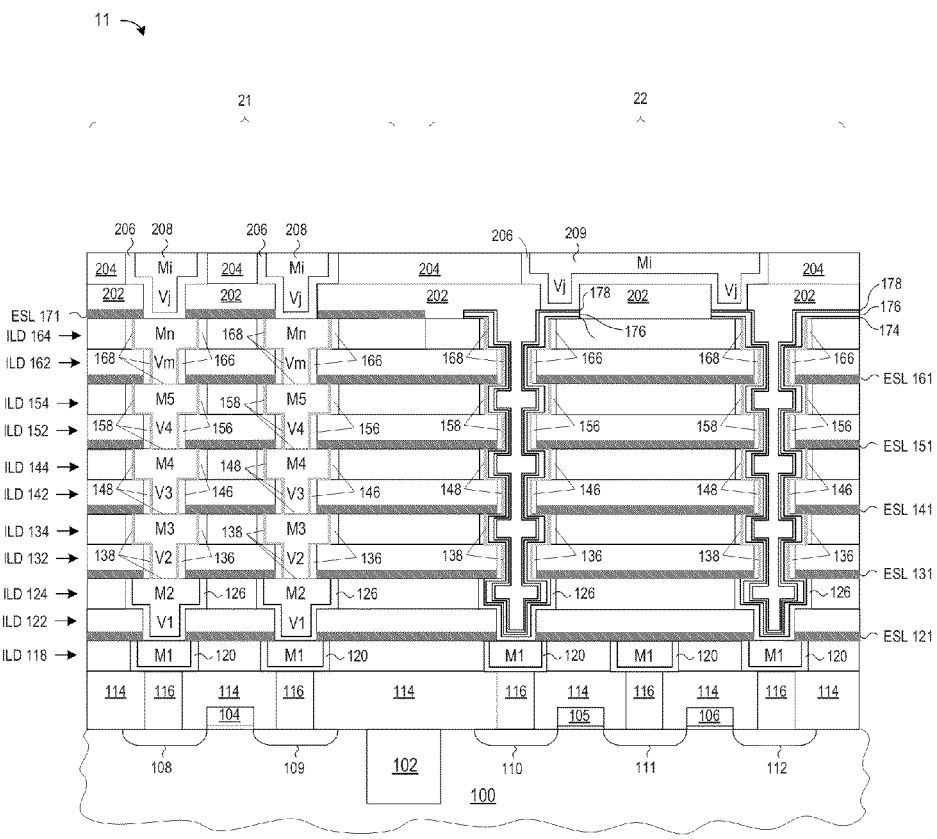

Turning now to FIG. 11, there is shown a simplified cross-sectional view illustrating processing of the semiconductor device 11 subsequent to FIG. 10 after forming one or more additional interconnect stack levels with metal interconnect lines over the logic and memory cell regions 21, 22. In selected embodiments, each additional interconnect stack level may be formed by selectively patterning and etching the ESL layer 171 over the logic region 21 to expose the uppermost metal (Mn) interconnect lines in the logic region 21. During etching of the ESL layer 171, the memory cell region 22 may be protected with an etch mask (not shown). After patterning the etch stop layer 171, a dual damascene process is used to form one or more via (Vj) structures and metal (Mi) interconnect lines having barrier metal liner layers 206 formed in one or more patterned inter-layer dielectric (ILD) layers 202, 204. For example, a first planarized dielectric layer 202 may be formed over the semiconductor device 11 by depositing one or more dielectric layers to cover the logic and memory regions 21, 22 to a predetermined thickness and to fill the deep trench holes 173 down through the plurality of metal interconnect stacks. The deposited ILD layer(s) 202 may be polished, patterned, and etched to form the via (Vj) openings aligned over the uppermost metal (Mn) interconnect lines in the logic region 21 and the top plate electrode layer landing pads 201 in the memory cell region 22. Subsequently, a second planarized dielectric layer 204 may be patterned and etched to form metal (Mi) openings aligned with the Vj openings. In the aligned Vj and Mi openings, one or more relatively thin barrier metal layers 206 (e.g., Ta, TaN, Ta/TaN, Ta/TiN, or WN) are conformally deposited using RF sputtering, CVD, PECVD, PVD, ALD, MBD, or any combination(s) thereof to a predetermined thickness in the range of 5-1000 Angstroms (e.g., 10-100 Angstroms). As illustrated, the conformally deposited barrier metal layers 206 cover the bottom and sidewall surfaces of the via openings. On the barrier metal layer 206, one or more layers of conductive metal material 208, 209 may be formed and planarized to fill the Vj and Mi openings, such as by forming one or more layers of suitable conductive material (e.g., copper) using CVD, PECVD, sputtering, PVD, electro-plating, electro-less plating, or the like, followed by chemical mechanical polish (CMP) planarization. In the memory cell region, the resulting planarized conductor layer 209 and barrier metal layer 206 are electrically connected to the top plate electrode layer 178 of the embedded metal interconnect capacitor in each cell. In addition, the bottom plate electrode layer in each embedded metal interconnect capacitor is connected across a respective transistor device to a separately controlled voltage node 111 in the substrate 100 to provide a buried bit line configuration.

By using the directional barrier metal layer formation process disclosed herein, an embedded metal interconnect capacitor may be formed that spans one or more metal layers of a given interconnect structure, where each layer includes metal lines and/or vias for electrically connecting one layer to the next and/or to various electronic circuitry otherwise integrated into the overall structure. In selected embodiments, the embedded metal interconnect capacitors may be integrated as embedded DRAM capacitors in a back-end logic fabrication process for a processor or other functional circuit, where the capacitors and various interconnect features (e.g., metal logic lines and vias, etc.) share the same layers. By spanning the embedded metal interconnect capacitor over multiple layers, greater capacitance levels can be achieved. The larger the capacitance of a given embedded DRAM cell, the greater the charge that can be stored by that cell. This higher charge allows for a longer capacitor leakage period before refresh is triggered. As a result, a three-dimensional MIM capacitor may be fully embedded in the interconnect stack with minimal impact to the existing process tools and flow.

As seen from above, selected embodiments of an embedded metal interconnect capacitor are described having increased capacitance by employing a directional barrier metal structure in a multi-level stacked copper interconnect structure that may be replaced with stacked MIM capacitor layers to form an embedded DRAM having a capacitor with increased sidewall surface electrode plate layers. Employing a dual damascene process to form the multi-level stacked copper interconnect structure, a directional barrier metal layer is formed by depositing one or more barrier metal layers by sputtering or ALD with appropriate bias conditions to effectively remove or thin the barrier metal layers from the bottom of each via opening so that the resulting dual damascene copper interconnect has very little or no barrier metal at the bottom of the via hole. As a result, the multi-level stacked copper interconnect structure may be selectively removed to form deep trench hole down through the multiple metal layers since there the barrier metal layer thickness remaining at the bottom of the via hole does not impede the etch process. In the deep trench holes. MIM capacitor layers may be formed to include a bottom plate electrode layer, high-k capacitor dielectric layer, and top plate electrode layer. However, it will be appreciated that various benefits of the present disclosure may also be obtained from forming embedded metal interconnect capacitor structures with other configurations and dimensions than disclosed herein.

By now it should be appreciated that there is provided herein an integrated circuit device with an embedded metal interconnect capacitor and associated fabrication process. The disclosed integrated circuit device includes a semiconductor substrate (e.g., SOI or bulk silicon) having one or more active circuits (e.g., embedded DRAM circuit) and at least a first conductive contact structure. The integrated circuit device also includes a stacked interconnect structure formed on the semiconductor substrate with multiple interconnect levels. As formed, each interconnect level includes a metal-based damascene interconnect structure having a first directional diffusion barrier liner layer located on a sidewall of a first opening in one or more patterned dielectric layers. In selected embodiments, the metal-based damascene interconnect structure includes electro-plated copper formed on the first directional diffusion barrier liner layer. Each interconnect level also includes a damascene capacitor structure having a second directional diffusion barrier liner layer located on a sidewall of a second opening in the one or more patterned dielectric layers and a plurality of capacitor layers formed on the directional diffusion barrier liner layer. As formed, the capacitor layers in each damascene capacitor structure may occupy space where a metal-containing damascene interconnect structure was formed prior to fabrication of an adjacent interconnect level, and may include a conductive bottom plate electrode layer, a high-k capacitor dielectric layer formed on the conductive bottom plate electrode layer, and a conductive top plate electrode layer formed on the high-k capacitor dielectric layer. In addition, the conductive bottom plate electrode layer in each damascene capacitor structure may be separated from the one or more patterned dielectric layers by at least the second directional diffusion barrier liner layer. In selected embodiments, the first and second directional diffusion barrier liner layers may each be formed with one or more sputter-deposited layers of TaN, Ta, TiN, and/or WN which are applied with bias condition to prevent formation of the sputter-deposited layers on horizontal surfaces. By aligning the fabrication process for the stacked interconnect structure, the metal-based damascene interconnect structures in each interconnect level are aligned for electrical connection to the one or more active circuits. In addition, the damascene capacitor structures in each interconnect level are aligned to form a single capacitor having a first capacitor plate electrically connected to the first conductive contact structure.

In another form, there is provided a semiconductor device and associated method of fabrication. In the disclosed methodology, a first opening having vertical and horizontal surfaces is formed in one or more first interconnect dielectric layers. For example, the dielectric layer opening may be formed with a first interlayer dielectric layer over a semiconductor substrate having one or more active circuits and at least a first conductive contact structure, where a first via opening is formed in the first interlayer dielectric layer in alignment with a first conductive contact structure. In addition, a second interlayer dielectric layer may be formed over a first interlayer dielectric layer, where a first trench opening is formed in the second interlayer dielectric layer in alignment with the first via opening. In the first opening, a first barrier metal material is deposited to form a barrier metal layer on the vertical and horizontal surfaces of the first opening. In selected embodiments, the first barrier metal material is formed by conformally coating the vertical and horizontal surfaces of the first opening with a barrier metal layer (e.g., a diffusion barrier liner layer including TaN, Ta, TiN, and/or WN) using RF sputtering, chemical vapor deposition, plasma-enhanced chemical vapor deposition, physical vapor deposition, atomic layer deposition, molecular beam deposition, or any combination thereof. In addition, a second barrier metal material is formed in the first opening to thicken the barrier metal layer on any vertical surface of the first opening and to thin or substantially remove the barrier metal layer on any horizontal surface of the first opening. In selected embodiments, the second barrier metal material is formed by coating the vertical and horizontal surfaces of the first opening with a directional barrier metal layer using bias conditions in combination with RF sputtering, plasma-enhanced chemical vapor deposition, physical vapor deposition, molecular beam deposition, or any combination thereof to thicken the barrier metal layer on any vertical surface of the first opening and to thin or substantially remove the barrier metal layer on any horizontal surface of the first opening. Subsequently, a conductive metal material is formed over any remaining barrier metal layer to fill the first opening. In selected embodiments, the conductive metal material is formed by electroplating copper on any remaining barrier metal layer to fill the first opening with electroplated copper, and planarizing the electroplated copper in the first opening to form a planarized damascene copper contact. Subsequently, the conductive metal material may be removed from the first opening while retaining any remaining barrier metal layer using a wet etch, dry etch, ablation, or any combination thereof to form a trench opening in the one or more first interconnect dielectric layers. In the trench opening, a capacitor may be formed by sequentially depositing a first capacitor plate electrode layer, a high-k dielectric layer on the first capacitor plate electrode layer, and a second capacitor plate electrode layer high-k dielectric layer. As formed, the first capacitor plate electrode layer in the trench opening may be separated from the one or more first interconnect dielectric layers by at least the barrier metal layer formed on any vertical surface of the trench opening.

In yet another form, there is disclosed an integrated circuit DRAM circuit and associated method fabrication. The integrated circuit DRAM includes substrate in which is formed at least a portion of a dynamic random access memory (DRAM) bit cell circuitry. The integrated circuit DRAM also includes a multilevel interconnect stack on the substrate comprising one or more first metal-containing interconnect features, each at least partially separated from dielectric material of the multilevel interconnect stack by a resputtered diffusion barrier sidewall liner layer. For example, the multilevel interconnect stack may include a metal-based damascene interconnect structure in each interconnect stack level including electro-plated copper formed on the resputtered diffusion barrier sidewall liner layer. In addition, the integrated circuit DRAM includes a capacitor formed at least in part in the multilevel interconnect stack comprising a bottom electrode layer, a dielectric layer, and a top electrode layer, wherein the bottom electrode layer is at least partially separated from dielectric material of the multilevel interconnect stack by a resputtered diffusion barrier sidewall liner layer. In selected embodiments, the resputtered diffusion barrier sidewall liner layer is formed with sputter-deposited layers of TaN, Ta, TiN, and/or WN which are applied with bias condition to prevent formation of the sputter-deposited layers on horizontal surfaces. As formed, the capacitor occupies a trench opening in the multilevel interconnect stack formed by etching one or more second metal-containing interconnect features formed in the multilevel interconnect stack to be at least partially separated from dielectric material of the multilevel interconnect stack by a resputtered diffusion barrier sidewall liner layer.

Although the described exemplary embodiments disclosed herein are directed to various embedded metal interconnect capacitor structures and methods for making same, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, the MIM capacitor is shown as being formed from the second metal (M2) level, but such embedded MIM capacitors can be made from the first metal (M1) level provided that the barrier metal at first metal (M1) level is sufficiently thick. And while the via and trench openings are shown as having a wide trench and narrow via hole, other damascene techniques may be used to form a single hole with smooth side wall surface. And while the active circuit areas are illustrated with simplified transistor devices in an embedded DRAM circuit, this is merely for convenience of explanation and not intended to be limiting and persons of skill in the art will understand that the principles taught herein apply to other devices and circuits. Moreover, the thicknesses, depths, and other dimensions of the described layers and openings may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device comprising:
  a semiconductor substrate comprising one or more active circuits and at least a first conductive contact structure; and
  a stacked interconnect structure formed on the semiconductor substrate with multiple interconnect levels, each interconnect level comprising:
    a metal-based damascene interconnect structure comprising a first directional diffusion barrier liner layer located on a sidewall of a first opening in one or more patterned dielectric layers; and
    a damascene capacitor structure comprising a second directional diffusion barrier liner layer located on a sidewall of a second opening in the one or more patterned dielectric layers and a plurality of capacitor layers formed on the directional diffusion barrier liner layer,
  where the metal-based damascene interconnect structures in each interconnect level are aligned for electrical connection to the one or more active circuits, and where the damascene capacitor structures in each interconnect level are aligned to form a single capacitor having a first capacitor plate electrically connected to the first conductive contact structure.

2. The integrated circuit device of claim 1, where the semiconductor substrate comprises a semiconductor on insulator (SOI) substrate or bulk semiconductor substrate.

3. The integrated circuit device of claim 1, where the one or more active circuits comprises an embedded dynamic random access memory circuit.

4. The integrated circuit device of claim 1, where the first and second directional diffusion barrier liner layers each comprise one or more sputter-deposited layers of TaN, Ta, TiN, and/or WN which are applied with bias condition to prevent formation of the sputter-deposited layers on horizontal surfaces.

5. The integrated circuit device of claim 1, where the metal-based damascene interconnect structure in each interconnect level comprises electro-plated copper formed on the first directional diffusion barrier liner layer.

6. The integrated circuit device of claim 1, where the plurality of capacitor layers in each damascene capacitor structure occupies space where a metal-containing damascene interconnect structure was formed prior to fabrication of an adjacent interconnect level.

7. The integrated circuit device of claim 1, where the plurality of capacitor layers in each damascene capacitor structure comprises a conductive bottom plate electrode layer, a high-k capacitor dielectric layer formed on the conductive bottom plate electrode layer, and a conductive top plate electrode layer formed on the high-k capacitor dielectric layer.

8. The integrated circuit device of claim 7, where the conductive bottom plate electrode layer in each damascene capacitor structure is separated from the one or more patterned dielectric layers by at least the second directional diffusion barrier liner layer.

9. An integrated circuit DRAM circuit, comprising:
  a substrate in which is formed at least a portion of a dynamic random access memory (DRAM) bit cell circuitry;
  a multilevel interconnect stack on the substrate comprising one or more first metal-containing interconnect features, each at least partially separated from dielectric material of the multilevel interconnect stack by a resputtered diffusion barrier sidewall liner layer; and
  a capacitor formed at least in part in the multilevel interconnect stack comprising a bottom electrode layer, a dielectric layer, and a top electrode layer, wherein the bottom electrode layer is at least partially separated from dielectric material of the multilevel interconnect stack by a resputtered diffusion barrier sidewall liner layer.

10. The integrated circuit DRAM circuit of claim 9, where the resputtered diffusion barrier sidewall liner layer comprises sputter-deposited layers of TaN, Ta, TiN, and/or WN which are applied with bias condition to prevent formation of the sputter-deposited layers on horizontal surfaces.

11. The integrated circuit DRAM circuit of claim 9, where the multilevel interconnect stack comprises a metal-based damascene interconnect structure in each interconnect stack level comprising electro-plated copper formed on the resputtered diffusion barrier sidewall liner layer.

12. The integrated circuit DRAM circuit of claim 9, where the capacitor occupies a trench opening in the multilevel interconnect stack formed by etching one or more second metal-containing interconnect features formed in the multilevel interconnect stack to be at least partially separated from dielectric material of the multilevel interconnect stack by a resputtered diffusion barrier sidewall liner layer.

* * * * *